US010288825B2

(12) United States Patent
Zhao et al.

(10) Patent No.: US 10,288,825 B2
(45) Date of Patent: May 14, 2019

(54) OPTICAL MODULE

(71) Applicants: Hisense Broadband Multimedia Technologies Co., Ltd., Qingdao (CN); Hisense Broadband Multimedia Technologies, Ltd., Tortola (VG)

(72) Inventors: Wei Zhao, Qingdao (CN); Dongmei Yu, Qingdao (CN)

(73) Assignees: HISENSE BROADBAND MULTIMEDIA TECHNOLOGIES CO., LTD., Qingdao, Shandong (CN); HISENSE BROADBAND MULTIMEDIA TECHNOLOGIES, LTD., Tortola (VG)

(*) Notice: Subject to any disclaimer, the term of this patent is extended or adjusted under 35 U.S.C. 154(b) by 0 days.

(21) Appl. No.: 15/850,124

(22) Filed: Dec. 21, 2017

(65) Prior Publication Data

US 2018/0180828 A1  Jun. 28, 2018

(30) Foreign Application Priority Data

Dec. 23, 2016 (CN) .......................... 2016 1 1204347
Dec. 23, 2016 (CN) .......................... 2016 1 1207814

(51) Int. Cl.
*G02B 6/42* (2006.01)
*H05K 1/02* (2006.01)
(Continued)

(52) U.S. Cl.
CPC ........... *G02B 6/4277* (2013.01); *G02B 6/428* (2013.01); *G02B 6/4279* (2013.01);
(Continued)

(58) Field of Classification Search
CPC ...... H05K 9/003; H05K 3/242; H05K 1/0216; H01L 23/489; H01L 23/49822; G02B 6/4201
(Continued)

(56) References Cited

U.S. PATENT DOCUMENTS 6,985,659 B2 * 1/2006 Torigoe ................ G02B 6/4201
  385/114
7,663,890 B2 * 2/2010 Nelson ................... H05K 3/242
  361/760

(Continued)

FOREIGN PATENT DOCUMENTS

CN 102271455 A 12/2011
CN 102378476 A  3/2012
(Continued)

OTHER PUBLICATIONS

State Intellectual Property Office of the People's Republic of China, Office Action and Search Report Issued in Application No. 201611204347.3, dated Jan. 29, 2018, 5 pages.
(Continued)

*Primary Examiner* — Tuan T Dinh
(74) *Attorney, Agent, or Firm* — Brinks, Gilson & Lione

(57) ABSTRACT

The present disclosure provides an optical module, including a circuit board, an optical chip and an optical chip driver. Where the circuit board includes a first layer provided with a first ground plane, a second layer provided with a second ground plane and a high-speed signal line between the first ground plane and the second ground plane. At least a part of the high-speed signal line is enclosed in a shielding cage which is formed by the first ground plane, the second ground plane and a plurality of metal vias connecting the first ground plane and the second ground plane in a way that the at least a part of the high-speed signal line is electromagnetic shielded by the shielding cage.

13 Claims, 9 Drawing Sheets

(51) Int. Cl.
*H05K 1/18* (2006.01)
*H05K 1/11* (2006.01)

(52) U.S. Cl.
CPC ......... *G02B 6/4281* (2013.01); *H05K 1/0219* (2013.01); *H05K 1/115* (2013.01); *H05K 1/181* (2013.01); *H05K 1/189* (2013.01); *H05K 1/118* (2013.01); *H05K 2201/0715* (2013.01); *H05K 2201/093* (2013.01); *H05K 2201/09027* (2013.01); *H05K 2201/09609* (2013.01); *H05K 2201/09618* (2013.01); *H05K 2201/10121* (2013.01); *H05K 2201/10522* (2013.01)

(58) Field of Classification Search
USPC ................ 361/760–764, 767, 775–778, 803; 385/114; 174/255–262
See application file for complete search history.

(56) References Cited

U.S. PATENT DOCUMENTS

| | | | | |
|---|---|---|---|---|
| 7,817,438 B2* | 10/2010 | Chang | .................. | H05K 1/0216 361/761 |
| 8,339,803 B2* | 12/2012 | Becker | .............. | H01L 23/49822 174/255 |
| 2007/0147745 A1 | 6/2007 | Fujimura | | |
| 2012/0205141 A1* | 8/2012 | Ogawa | .................. | H05K 1/024 174/250 |
| 2013/0141883 A1* | 6/2013 | Steinbeiser | ............ | H05K 9/003 361/760 |
| 2014/0364004 A1* | 12/2014 | Oniki | .................. | H01R 12/775 439/497 |
| 2015/0096732 A1 | 4/2015 | Teo et al. | | |
| 2015/0342030 A1* | 11/2015 | Watanabe | ............ | H05K 1/0216 174/268 |

FOREIGN PATENT DOCUMENTS

| | | | | |
|---|---|---|---|---|
| CN | 103260335 A | 8/2013 | | |
| WO | WO-2010103721 A1 * | 9/2010 | ........... | H05K 1/0253 |
| WO | WO-2015194069 A1 * | 12/2015 | .............. | H01P 3/085 |

OTHER PUBLICATIONS

State Intellectual Property Office of the People's Republic of China, Office Action and Search Report Issued in Application No. 201611207814.8, dated Jan. 29, 2018, 5 pages.

* cited by examiner

OPTICAL MODULE

CROSS REFERENCE TO RELATED APPLICATIONS

This application claims priority to Chinese Patent Application No. 201611207814.8 entitled "OPTICAL MODULE," filed on Dec. 23, 2016, and also claims priority to Chinese Patent Application No. 201611204347.3 entitled "OPTICAL MODULE," filed on Dec. 23, 2016, the entirety of both of which are hereby incorporated by reference herein.

TECHNICAL FIELD

The present disclosure relates to an optical module in the field of optical communications.

BACKGROUND

An optical module is one of the most important devices in an optical fibre communication system. With the development of communication technology, the type and the number of optical modules are increasing. The optical module may include an optical chip, a functional circuit and an optical interface, where the optical chip may include a laser as an optical transmitter and a detector as an optical receiver. After the laser generates an optical signal according to an electrical signal, the optical signal may be transmitted to the optical receiver through optical fibre, and then may be converted into the electrical signal by the detector.

SUMMARY

The present disclosure provides an optical module to improve Electro Magnetic Compatibility (EMC) performance of the optical module.

The present disclosure features an optical module, including a circuit board, an optical chip and an optical chip driver; wherein the circuit board includes: a first layer provided with a first ground plane, a second layer provided with a second ground plane and a high-speed signal line between the first ground plane and the second ground plane. At least a part of the high-speed signal line is enclosed in a shielding cage which is formed by the first ground plane, the second ground plane and a plurality of metal vias connecting the first ground plane and the second ground plane in a way that the at least a part of the high-speed signal line is electro-magnetic shielded by the shielding cage.

In the present disclosure, a shielding cage may be formed by two ground planes and multiple metal vias on a circuit board. The at least a part of the high-speed signal line may be enclosed in the shielding cage. Electromagnetic radiation from the high-speed signal line which is leaked out of the circuit board may be greatly reduced, thereby effectively improving the EMC performance of the optical module.

BRIEF DESCRIPTION OF DRAWINGS

The details of one or more embodiments of the subject matter described in the present disclosure are set forth in the accompanying drawings and description below. Other features, aspects, and advantages of the subject matter will become apparent from the description, the drawings, and the claims. Features of the present disclosure are illustrated by way of example and not limited in the following figures, in which like numerals indicate like elements.

Figure 1:
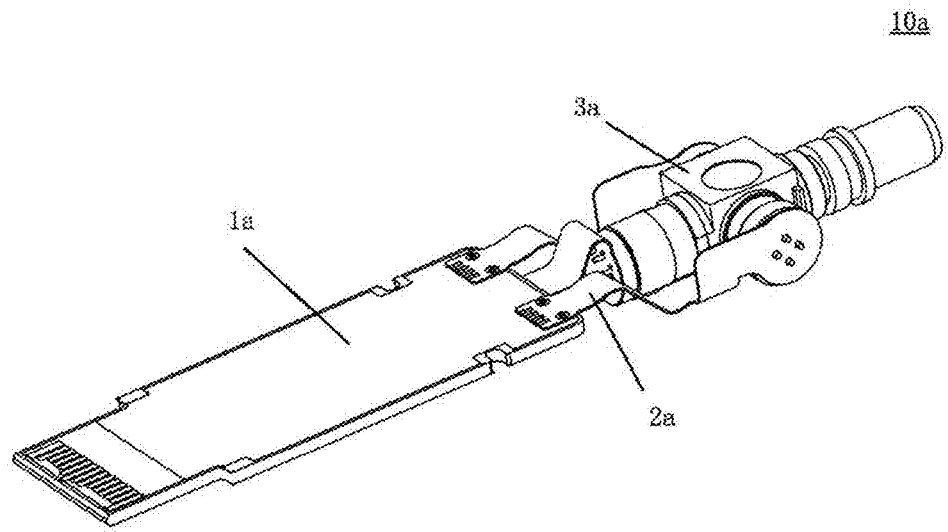
FIG. 1 is a structural schematic diagram of a conventional optical module.

Herein, reference numerals are described as follows:
10a: optical module;
1a: rigid circuit board;
2a: flexible circuit board;
3a: optical sub-assembly;
21a: dielectric layer;
22a, 23a: metal layers;
223a, 225a: high-speed signal lines;
227a: power line;
231a: ground wire;
10, 10c: optical modules;
1: rigid circuit board;
2: circuit board;
3: optical sub-assembly;
4: gold finger;
5a: optical chip;
5b: optical chip driver;
6: lens assembly;
7: optical connector;
8: flexible circuit board;
20: shielding cage;
21: top side metal layer;
23, 27: dielectric layers;
25: intermediate metal layer;
22, 24, 26, 28: metal vias;
29: bottom side metal layer;
2101, 2103, 2106, 2108: high-speed ports on the top side metal layer;
2105, 2107, 2109: grounding ports on top side metal layer;
211: upper ground plane;
213: boundary wire;
215, 217: continuous follow wires on the top side metal layer;

219: low-speed line;
2501, 2503, 2506, 2508: high-speed ports on the intermediate metal layer;
2505, 2507, 2509: grounding ports on the intermediate metal layer;
255, 257: high-speed signal lines;
2901, 2903, 2906, 2908: high-speed ports on the bottom side metal layer;
2905, 2907, 2909: grounding ports on the bottom side metal layer;
291: lower ground plane:
293: boundary line;
295, 297: continuous follow wires;
299: low-speed line.

DETAILED DESCRIPTION

Referring to FIG. 1, a circuit board in an optical module 10a may include a flexible circuit board 2a and a rigid circuit board 1a. The flexible circuit board 2a may be configured to connect the rigid circuit board 1a and an optical sub-assembly 3a. The optical sub-assembly 3a may be a Receiving Optical Sub-Assembly (ROSA), a Transmitting Optical Sub-Assembly (TOSA) or a Bi-Directional Optical Sub-Assembly (BOSA). The optical module 10a may include an optical chip and an optical chip driver. The optical chip may be located in the optical sub-assembly 3a, and the optical chip driver may be located in the rigid circuit board 1a. In an example, when the optical chip is a laser, the driver thereof may be a device for transmitting signal. In another example, when the optical chip is a detector, the driver thereof may be a device for receiving signal.

In a high-speed optical module, high-speed signal may be transmitted on the circuit board, for example, at a signal transmission rate of 25 G, 28 G or the like. As a high-speed signal line will produce relatively high electromagnetic radiation, the relatively high electromagnetic radiation may be leaked from the high-speed optical module. In this way, the operation of other devices may be disturbed. Therefore, the electromagnetic radiation problem is one of the technical problems to be solved for the high-speed optical module.

Figure 2:
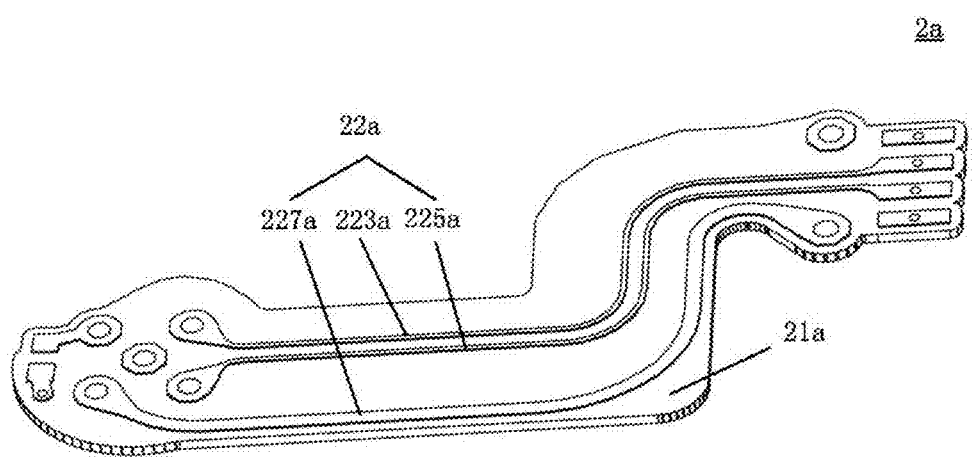
FIG. 2 is a perspective schematic diagram of a flexible circuit board in the optical module as shown in FIG. 1.
Figure 3:
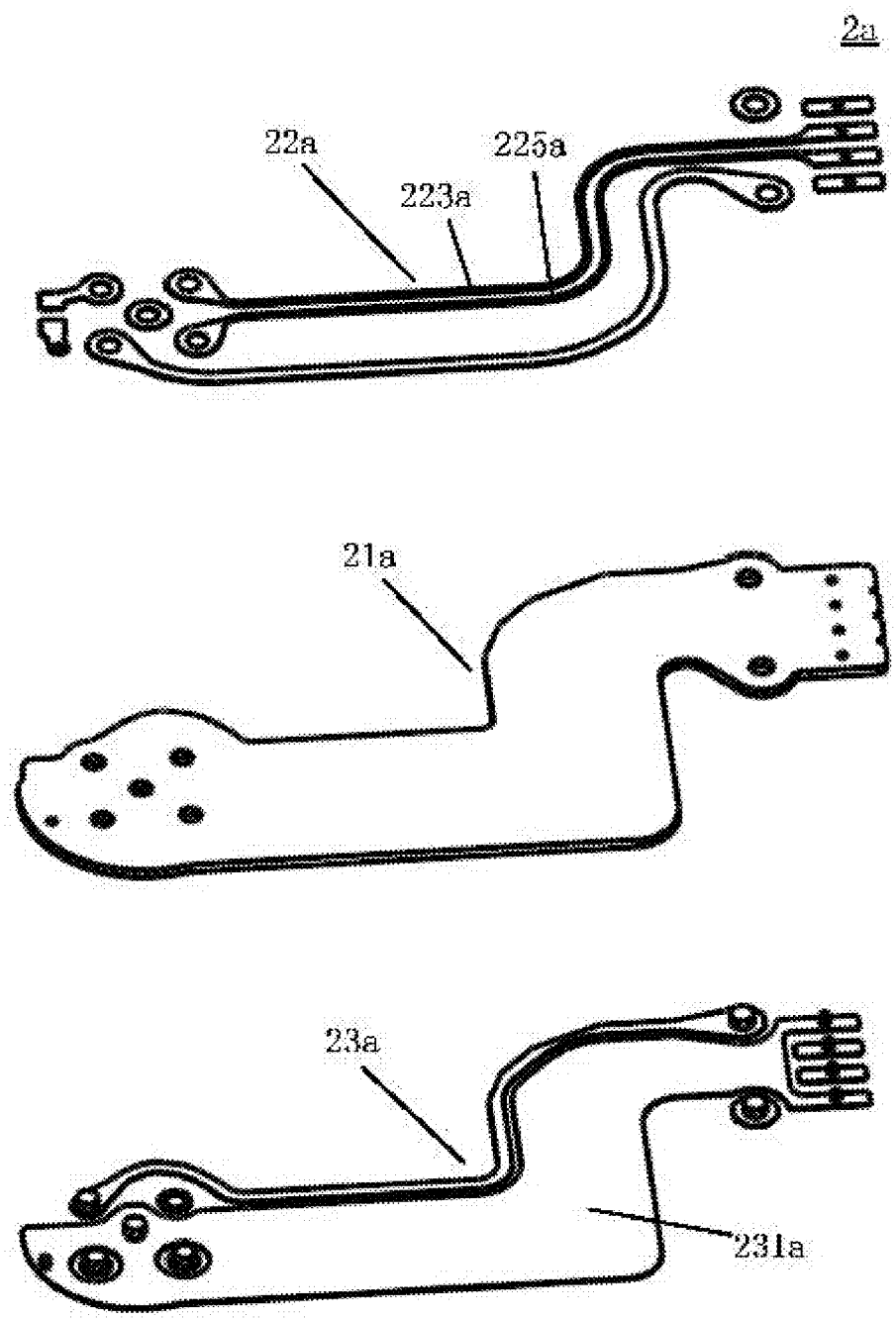
FIG. 3 is an exploded perspective schematic diagram of a flexible circuit board in the optical module as shown in FIG. 1.

Referring to FIG. 2 and FIG. 3, the flexible circuit board 2a may include a dielectric layer 21a and two metal layers 22a, 23a respectively located on two sides of the dielectric layer 21a. Herein, the high-speed signal lines 223a, 225a may be provided on the metal layer 22a. On the metal layer 23a, a ground wire 231a may be layout on the metal layer 23a so as to form a ground reference plane. Other wires may be provided on the two metal layers 22a, 23a, for example, a power line 227a.

Figure 4:
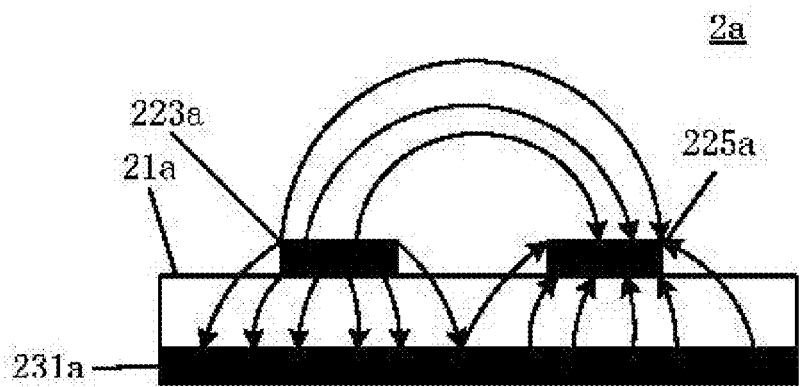
FIG. 4 is a schematic diagram of radiation from a microstrip line of a flexible circuit board in the optical module as shown in FIG. 1.

Referring to FIG. 4, since each of the high-speed signal lines 223a, 225a may be a microstrip line, such microstrip line may produce a relatively larger outward electromagnetic radiation when transmitting a signal of high frequency (e.g., higher than 8 GHz), large voltage (e.g., higher than 2 v) and/or large current (e.g., greater than 40 mA). In an example, electromagnetic field may be formed in a space between the high-speed signal lines 223a, 225a and the ground reference plane 231a. Electromagnetic field may also be formed in a space between the high-speed signal line 223a and the high-speed signal line 225a. Electromagnetic field may freely radiate to outer space. The higher the transmission rate of a high-speed signal line, the larger the current and voltage, and the greater the electromagnetic radiation. Electromagnetic radiation may cause an EMC problem for the optical module 10a. In this way, EMC performance of a device in which the optical module 10a is installed may not meet an actual requirement.

The present disclosure provides an optical module, which includes a circuit board, an optical chip and an optical chip driver. The circuit board may have an upper ground plane and a lower ground plane facing each other. A high-speed signal line may be located between the two ground planes. The optical chip and the optical chip driver may be connected by the high-speed signal line. Multiple metal vias which connects the two ground planes may be provided around the high-speed signal line. The two ground planes and the multiple metal vias may form a shielding cage to realize electromagnetic shielding for the high-speed signal line.

Figure 5:
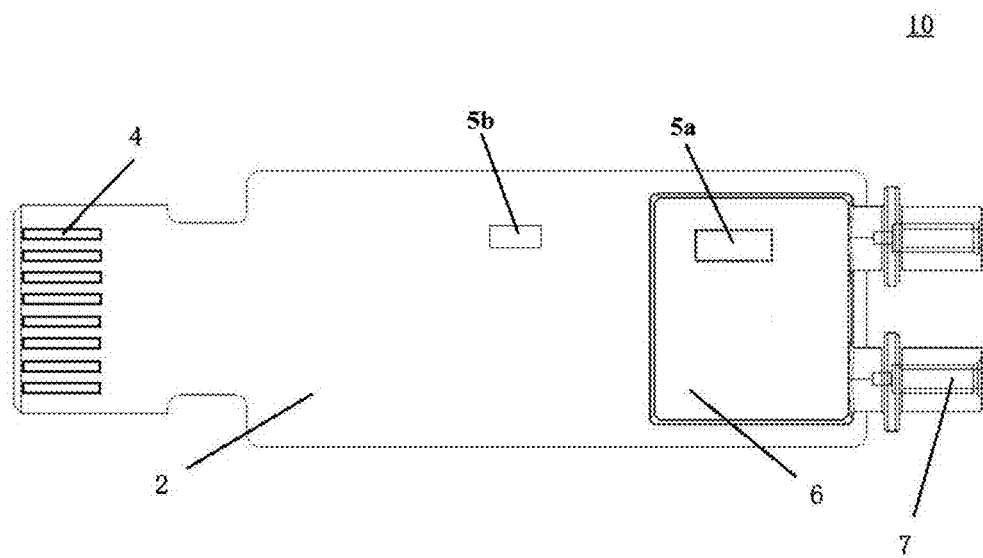
FIG. 5 is a structure schematic diagram of an optical module according to an example of the present disclosure.

FIG. 5 is a structure schematic diagram of an optical module according to an example of the present disclosure. Referring to FIG. 5, the optical module 10 may include a circuit board 2, a gold finger 4 provided at one end of the circuit board 2, an optical chip 5a, an optical chip driver 5b, a lens assembly 6 and an optical connector 7. Where, the optical chip 5a and/or the optical chip driver 5b may be provided on the circuit board 2 in a form of a Chip On Board (COB).

Figure 6:
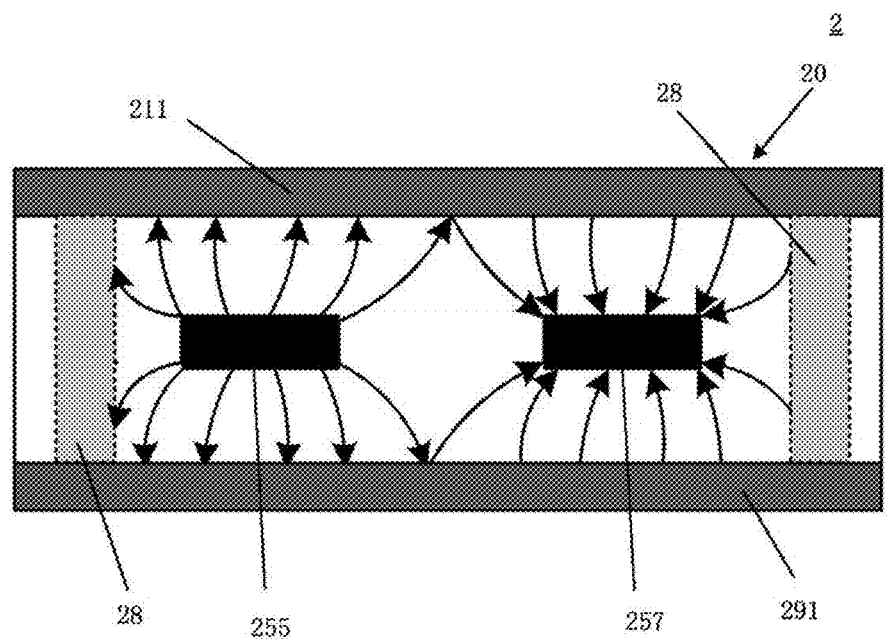
FIG. 6 is a schematic diagram of an electromagnetic shielding principle of a circuit board in the optical module as shown in FIG. 5.

Referring to FIG. 6, it is a schematic diagram of an electromagnetic shielding principle of a circuit board in the optical module 10 as shown in FIG. 5. The circuit board 2 may be a multilayer board. The circuit board 2 may include high-speed signal lines 255, 257 connected to the optical chip driver 5b. The optical chip driver 5b may be connected to one end of the high-speed signal lines 255, 257. The optical chip 5a may be connected to the other end of the high-speed signal lines 255, 257. When the optical chip 5a is driven by the driver 5b, a propagating direction of light emitted by the optical chip 5a may be changed by the lens assembly 6. In this way, the optical chip 5a may be optically connected with an optical connector 7. The circuit board 2 may include an upper ground plane 211 and a lower ground plane 291 facing each other. The high-speed signal lines 255, 257 may be provided between the two ground planes 211, 291. The high-speed signal lines 255, 257 and the upper ground plane 211 may be spaced by a dielectric layer 23 (referring to FIG. 11). The high-speed signal lines 255, 257 and the lower ground plane 291 may be spaced by a dielectric layer 27 (referring to FIG. 11). Multiple metal vias 28 may be arranged around the high-speed signal lines 255, 257. The upper ground plane 211 and the lower ground plane 291 may be connected by these metal vias 28. In this way, these metal vias 28 and the two ground planes 211, 291 may form a shielding cage 20 together, which may enclose the high-speed signal lines 255, 257. In an example, since the high-speed signal lines 255, 257 often transmit differential signals, the high-speed signal lines 255, 257 may be arranged on the circuit board 2 in pairs and these metal vias 28 may be provided around the paired high-speed signal lines 255, 257. In this way, electromagnetic radiation from the high-speed signal lines 255, 257 may be reduced, thereby improving EMC performance of the optical module 10.

Figure 7:
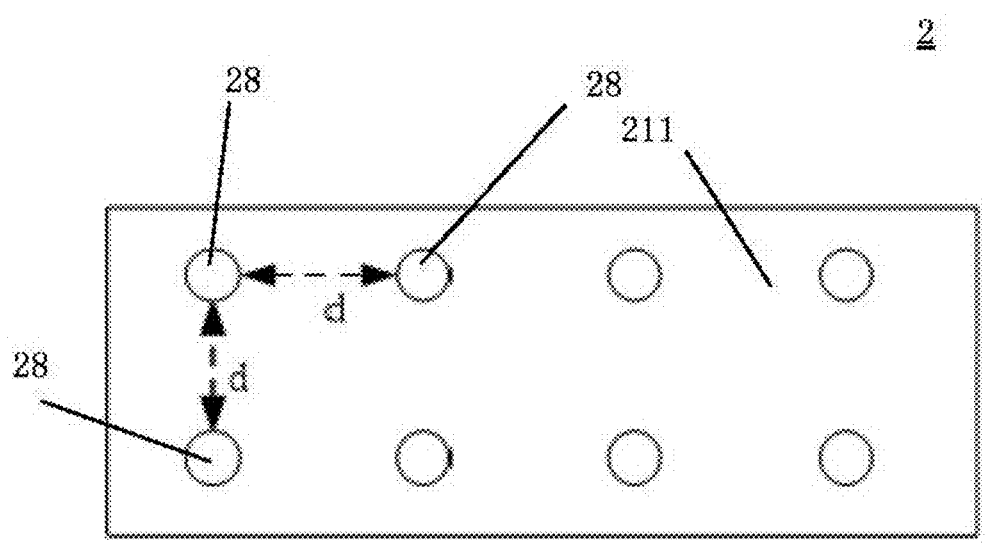
FIG. 7 is a top schematic diagram of a circuit board in the optical module as shown in FIG. 5.
Figure 8:
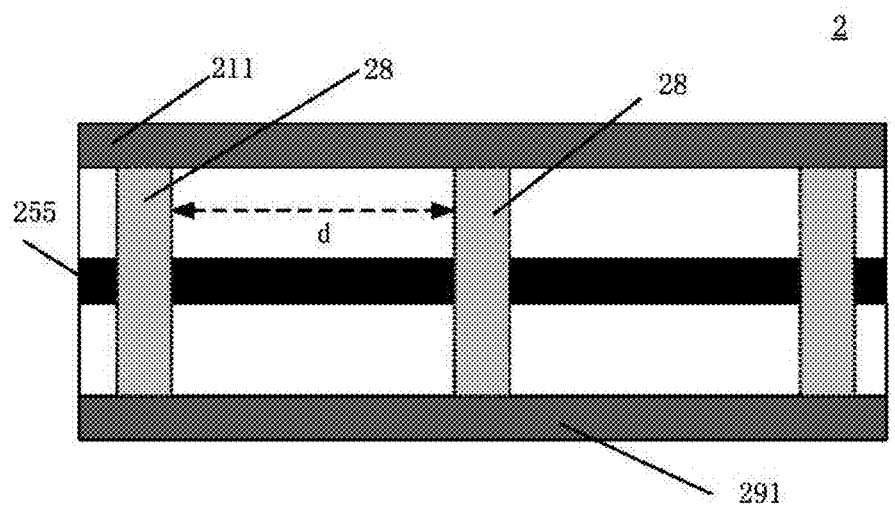
FIG. 8 is a perspective cross-sectional schematic diagram of a circuit board in the optical module as shown in FIG. 5.

Referring to FIG. 7 and FIG. 8, FIG. 7 is a top schematic diagram of a circuit board in the optical module 10 as shown in FIG. 5. FIG. 8 is a perspective cross-sectional schematic diagram of a circuit board in the optical module 10 as shown in FIG. 5. As shown in FIG. 7 and FIG. 8, a cage-like structure for electromagnetic shielding may be formed between multiple metal vias 28 and the two ground planes 211, 291. Herein the upper ground plane 211 may be a top plane of the cage-like structure and the lower ground plane 291 may be a bottom plane of the cage-like structure. The metal vias 28 may be substantially perpendicularly to the two ground planes 211, 291. The metal vias 28 may be regarded as a fence of the cage-like structure.

In order to avoid leakage of electromagnetic radiation generated by the high-speed signal lines 255, 257 from a gap between the metal vias 28, a distance d between these metal vias 28 may be set as required. The distance d between every two adjacent metal vias 28 does not exceed 1/n of a working wavelength of the high-speed signal lines 255, 257. Where the working wavelength of the high-speed signal lines 255, 257 may be related to a signal transmission medium and working frequency. Specifically, the working wavelength λ of the high-speed signal lines 255, 257 may be obtained according to the following formula:

$$\lambda = \frac{C/f}{\sqrt{\varepsilon_r}}.$$

Where λ may represent the working wavelength of the high-speed signal lines 255, 257, C may represent a propagation speed (about $3*10^8$ m/s) of the electromagnetic wave in vacuum, f may represent the working frequency of the high-speed signal lines 255, 257 and $\varepsilon_r$ may represent a relative dielectric constant of the signal transmission medium. It shall be noted that the working frequency of the high-speed signal lines 255, 257 may be approximately determined on the basis of a typical data rate of the optical module 10. For example, when the typical data rate of the optical module 10 is 10 G bit/s, those skilled in the art can set a frequency range for testing a sensitive frequency point of the high-speed signal line based on pseudo-random code to 30 Mhz-20 Ghz. In this way, to ensure the electromagnetic shielding effect for the high-speed signal line, the working frequency of the high-speed signal line may be 20 Ghz so as to determine the above mentioned distance d. Similarly, when the typical data rate of the optical module 10 is 20 G bit/s, the working frequency of the high-speed signal line may be 40 Ghz so as to determine the above mentioned distance d. When the typical data rate of the optical module 10 is 28 G bit/s, the working frequency of the high-speed signal line may be 56 Ghz so as to determine the above mentioned distance d. In addition, n may be greater than or equal to 2, and may be an empirical value or an experimental value. In an example, n may be equal to 2. In this way, the distance d between every two adjacent metal vias 28 does not exceed ½ of the working wavelength of the high-speed signal lines 255, 257. In another example, the distance d between every two adjacent metal vias 28 does not exceed 1/10 of the working wavelength of the high-speed signal lines 255, 257. In still another example, the distance d between every two adjacent metal vias 28 does not exceed 1/15 of the working wavelength of the high-speed signal lines 255, 257. In yet another example, the distance d between every two adjacent metal vias 28 does not exceed 1/20 of the working wavelength of the high-speed signal lines 255, 257. The electromagnetic radiation generated by the high-speed signal lines 255, 257 may be effectively shielded in the shielding cage 20 when n is greater than or equal to 15 based on multiple experiment results of the inventor. Herein the electromagnetic radiation may include a fundamental frequency component corresponding to the working wavelength and a several-level higher-order harmonic component corresponding to the fundamental frequency. It is noted that the working frequency of the high-speed signal line and the typical data rate of the optical module are positively correlated.

In an example, the upper ground plane 211 may be provided on a top of the circuit board 2; and the lower ground plane 291 may be provided on a bottom of the circuit board 2. When a high-speed signal line transmits signal, electromagnetic wave may be generated around the high-speed signal line and wavelength of the electromagnetic wave may be the working wavelength of the high-speed signal line. The distance d between the metal vias 28 may be set according to the principle that electromagnetic wave is transmitted to outer space and the working wavelength of the high-speed signal lines 255, 257 so as to avoid leakage of electromagnetic radiation generated by the high-speed signal lines 255, 257 from the gap between the metal vias 28.

According to the above examples, an optical chip and an optical chip driver in an optical module may be connected by a high-speed signal line in a circuit board. Two ground planes in the circuit board and multiple metal vias connecting the two ground planes may form a cage-like structure. The cage-like structure may have an effect of electromagnetic shielding. The high-speed signal line may be enclosed in the cage-like structure, and outward radiation of electromagnetic field around the high-speed signal line may be effectively constrained. On the circuit board 2, the two ground planes 211, 291 and several metal vias 28 may form a shielding cage 20, which encloses the high-speed signal lines 255, 257. In this way, the leakage of electromagnetic radiation generated by the high-speed signal lines 255, 257 may be greatly reduced, thereby effectively improving EMC performance of the optical module 10.

By comparing FIG. 4 with FIG. 6, it may be seen that electromagnetic field may be effectively enclosed by the cage-like structure in FIG. 6, rather than electromagnetic field radiates to outer space freely as shown in FIG. 4.

Figure 9:
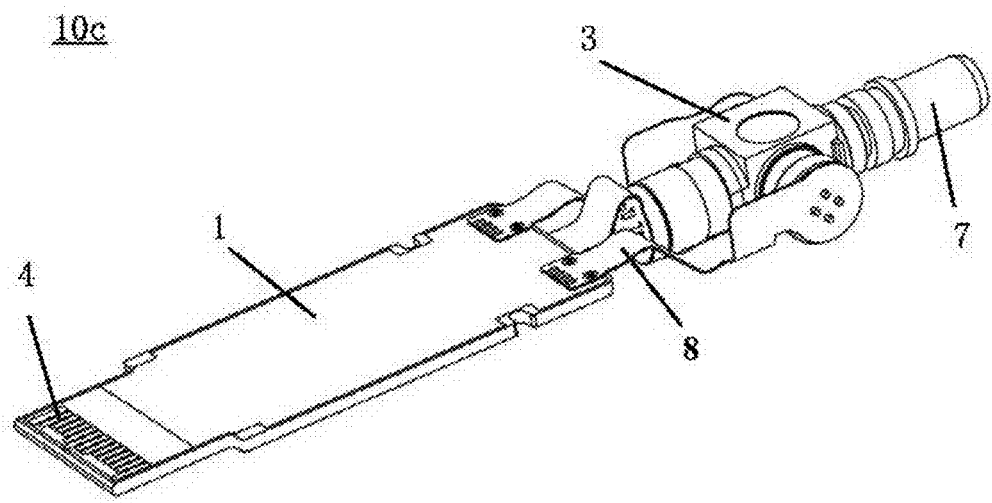
FIG. 9 is a structure schematic diagram of an optical module according to another example of the present disclosure.

FIG. 9 is a structure schematic diagram of an optical module according to another example of the present disclosure. Referring to FIG. 9, the optical module 10c may include a rigid circuit board 1, a flexible circuit board 8, an optical sub-assembly 3, the gold finger 4 provided at one end of the rigid circuit board 1 and the optical connector 7 connected with the optical sub-assembly 3.

Figure 10:
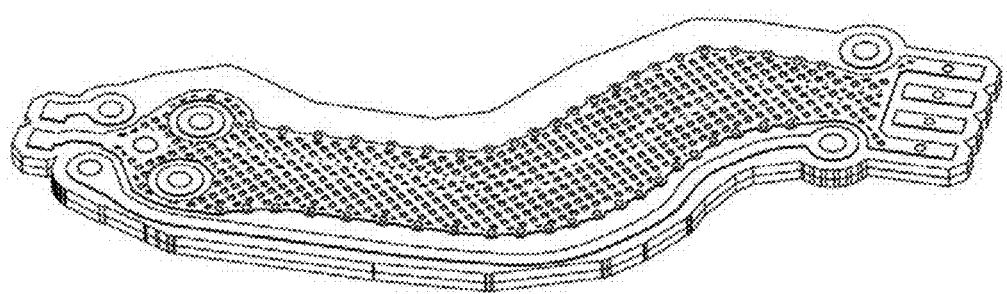
FIG. 10 is a perspective structure schematic diagram of a flexible circuit board in the optical module as shown in FIG. 9.
Figure 11:
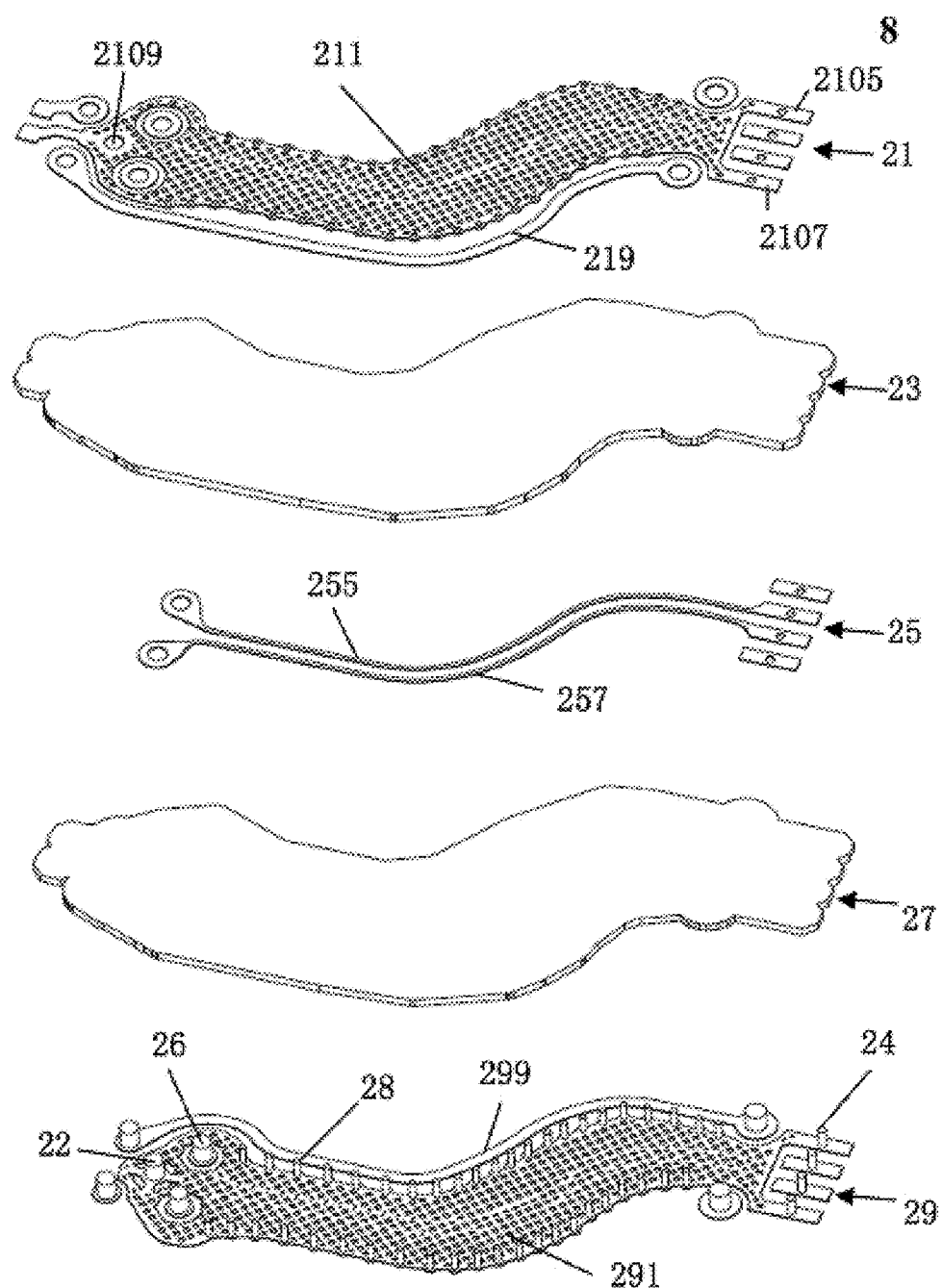
FIG. 11 is an exploded perspective structure schematic diagram of the flexible circuit board as shown in FIG. 10.
Figure 12:
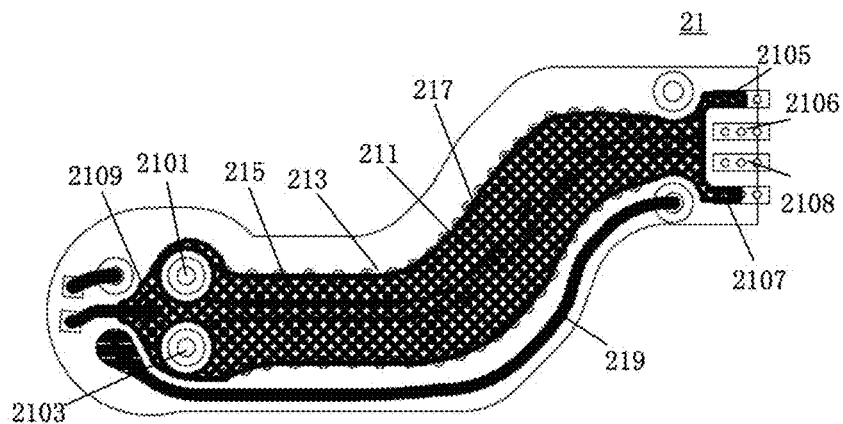
FIG. 12 is a schematic diagram of a top metal layer wiring of the flexible circuit board as shown in FIG. 10.
Figure 13:
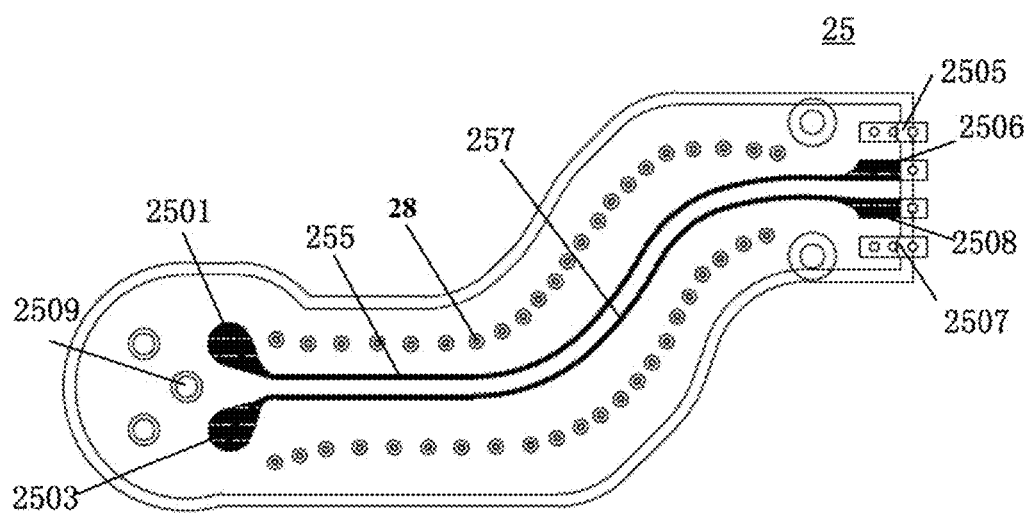
FIG. 13 is a schematic diagram of an intermediate metal layer wiring of the flexible circuit board as shown in FIG. 10.
Figure 14:
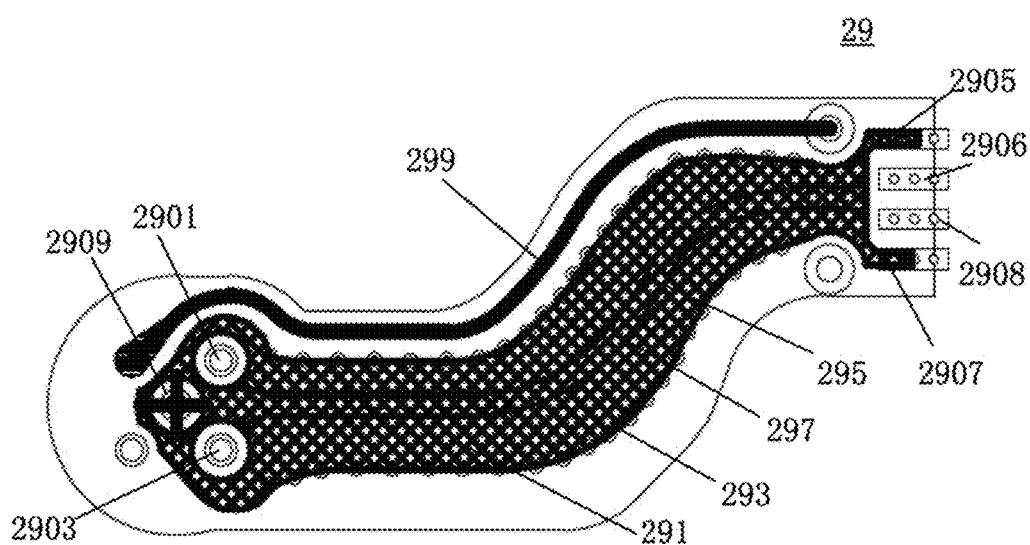
FIG. 14 is a schematic diagram of a bottom metal layer wiring of the flexible circuit board as shown in FIG. 10.

Referring to FIG. 10 to FIG. 14, FIG. 10 is a perspective structure schematic diagram of a flexible circuit board in the optical module 10c as shown in FIG. 9. FIG. 11 is an exploded perspective structure schematic diagram of the flexible circuit board 8 as shown in FIG. 10. FIG. 12 is a schematic diagram of a top metal layer wiring of the flexible circuit board 8 as shown in FIG. 10. FIG. 13 is a schematic diagram of an intermediate metal layer wiring of the flexible circuit board 8 as shown in FIG. 10. FIG. 14 is a schematic diagram of a bottom metal layer wiring of the flexible circuit board 8 as shown in FIG. 10. The flexible circuit board 8 may be a multilayer board. The flexible circuit board 8 may include two dielectric layers 23, 27 and three metal layers 21, 25, 29. From top to bottom, the flexible circuit board 8 may be exploded as the top metal layer 21, the dielectric layer 23, the intermediate metal layer 25, the dielectric layer 27 and the bottom metal layer 29 as shown in FIG. 11. It may be understood that one side for each of the top metal layer 21 and the bottom metal layer 29 may be covered with an insulating film.

The high-speed signal lines 255, 257 may be arranged on the intermediate metal layer 25. The top metal layer 21 may be arranged with the upper ground plane 211 and the bottom metal layer 29 may be arranged with the lower ground plane 291. The two ground planes 211, 291 may be connected by the metal vias 28. As shown in FIG. 11, the top metal layer 21 and the bottom metal layer 29 may be connected by multiple metal vias 28 which are substantially vertical to the top metal layer 21 and the bottom metal layer 29. It shall be understood that the two ground planes 211, 291 and these metal vias 28 may form a shielding cage which encloses the high-speed signal lines 255, 257. This structure may enclose electromagnetic radiation generated by the high-speed signal lines 255, 257 in the shielding cage, so that EMC performance of the optical module 10c may be effectively improved. It shall be noted that the shielding cage herein may also be applicable to the relevant content of the shielding cage 20 shown in FIGS. 6, 7 and 8, and further description is omitted for brevity.

Referring to FIGS. 11 and 12, in addition to the upper ground plane 211 on the top metal layer 21, four high-speed ports 2101, 2103, 2106, 2108 and three grounding ports 2105, 2107 and 2109 may be provided on the top metal layer 21. Where two high-speed ports 2101, 2106 may connect two ends of the high-speed signal line 255, respectively; the other two high-speed ports 2103 and 2108 may connect two ends of the high-speed signal line 257, respectively; the grounding ports 2105, 2107 may be connected with the upper ground plane 211 and located on the right side of the upper ground plane 211; and the grounding port 2109 may be connected with the upper ground plane 211 and located on the left side of the upper ground plane 211. In an example, the upper ground plane 211 may be fish-shaped, where the left side may correspond to a head of the fish and the right side may correspond to a tail of the fish.

The flexible circuit board 8 may include a metal mesh layer. The metal mesh layer may be grounded to form the above ground planes 211, 291.

In an example, as shown in FIG. 11, the metal mesh layer may include multiple metal grids. The metal grids may be a hollow mesh structure formed in a way that metal wires are intersected with each other. The metal mesh layer may be grounded to form the above ground planes 211, 291.

The metal mesh layer in the present disclosure may have a better flexibility and be easier to be bent compared to a common metal layer. Such design may be applied to a flexible circuit board. Even if a ground plane is added on the flexible circuit board, flexibility of the flexible circuit board may also be maintained.

In addition, in the top metal layer 21, a region where the two high-speed signal lines 255, 257 are projected onto the metal mesh layer may have two continuous follow wires 215, 217. Shape, line width and orthographic projection position of the two continuous follow wires 215, 217 may be substantially consistent with those of the two high-speed signal lines 255, 257. This structure may provide a signal return path for the two high-speed signal lines 255, 257. It shall be noted that there are also two continuous follow wires in the bottom metal layer 29 to provide a signal return path for the two high-speed signal lines 255, 257.

When the high-speed signal line transmits signal, the ground plane may provide a signal return path. For example, a projection region of the high-speed signal line on the ground plane may be a main path for signal return. When the metal mesh structure is used as the ground plane, the above signal return path may pass through hollow regions in the mesh structure, so that the main signal return path may twist. Therefore, the projection region of the high-speed signal line on the ground plane may have a continuous follow wire according to the above examples of the present disclosure. In this way, signals may return smoothly according to a set path in the presence of the hollow regions of the mesh structure.

As shown in FIG. 12, a wire may be provided in the metal mesh structure in a way that the wire passes through hollow regions of the metal mesh structure. Hereinafter, the wire may be referred to as a continuous follow wire. The continuous follow wire may follow the high-speed signal line to extend. Region outside the continuous follow wire may use the hollow metal grids, so that the main signal return path may be kept unobstructed while providing flexibility.

In the present disclosure, the continuous follow wire may be used to provide the return path for the high-speed signals and it may not be parallel to the wires forming the metal mesh structure. It is because, if the metal mesh structure forming the ground plane includes a wire adjacent and parallel to the continuous follow wire, the high-speed signal may spread to the adjacent wire so that the high-speed signal may return through multiple paths. For example, if each of grids in the metal mesh structure is square-shaped and the continuous follow wire is parallel to a side of the square, the high-speed signals may return through sides of the squares. In this case, in the present disclosure, the continuous follow wire may not be parallel to any side of the square. In this way, no continuous wire which may follow a signal stream in the high-speed signal line may be formed between the metal grids. The high-speed signals may return along the set continuous follow wire, so as to effectively avoid the high-speed signals returns through sides of the squares.

For example, when the grids in the metal mesh structure are square-shaped, the high-speed signal lines 255, 257 may travel in a way that the high-speed signal lines 255, 257 are parallel to a diagonal of the grids as much as possible.

A low-speed line 219 may be provided outside the upper ground plane 211. That is, other lines (including the low-speed signal line and a power line) except the two high-speed signal lines 255, 257 may be located outside the shielding cage. In this way, the volume of the shielding cage may be reduced.

In an example, the metal mesh structure in the upper ground plane 211 is formed of grids for which each side is a minimum width of the circuit board process. For example, the metal mesh structure is formed of grids for which each side may be 2-4 mils (1 mil=0.0254 mm). The metal mesh structure is formed of grids for which each side may also be 2.5-3.8 mils. The metal mesh structure is formed of grids for which each side may also be 3-3.5 mils. In an example, the distance between every two adjacent metal vias 28 at a boundary wire 213 may be less than ½ of the working wavelength of the high-speed signal lines 255, 257. In an example, the distance between every two adjacent metal vias 28 at the boundary wire 213 is less than 1/10 of the working wavelength of the high-speed signal lines 255, 257. In an example, the distance between every two adjacent metal vias 28 at the boundary wire 213 is less than 1/15 of the working wavelength of the high-speed signal lines 255, 257. In an example, the distance between every two adjacent metal vias 28 at the boundary wire 213 is less than 1/20 of the working wavelength of the high-speed signal lines 255, 257. This structure may effectively avoid the leakage of electromagnetic radiation generated by the high-speed signal lines 255, 257 from the grids on the upper ground plane 211.

It shall be noted that the upper ground plane 211 based on the metal mesh structure may facilitate increasing flexibility of the flexible circuit board 8. In addition, in order to further increase flexibility of the flexible circuit board 8, the top metal layer 21 may use thin metal material.

An edge of the upper ground plane 211 may be provided with a boundary wire 213. Multiple metal vias 28 may be disposed on the boundary wire 213. The metal vias 28 may pass through the dielectric layer 23 and the dielectric layer 27 in order, so as to connect the lower ground plane 291 with the upper ground plane 211.

Similarly, referring to FIG. 11 and FIG. 14, the lower ground plane 291 is provided on the bottom metal layer 29. Four high-speed ports 2901, 2903, 2906, 2908 and three grounding ports 2905, 2907, 2909 may be provided on the bottom metal layer 29. Where two high-speed ports 2901, 2906 connects two ends of the high-speed signal line 255, respectively; the other two high-speed ports 2903 and 2908 connects two ends of the high-speed signal line 257, respectively; the grounding ports 2905, 2907 may be connected with the lower ground plane 291 and located on the right side of the lower ground plane 291; and the grounding port 2909 may be connected with the lower ground plane 291 and located on the left side of the lower ground plane 291. In an example, the ground plane 291 may be fish-shaped, where the left side corresponds to a head of the fish and the right side corresponds to a tail of the fish.

Similar to the upper ground plane 211, the lower ground plane 291 may be a mesh structure. An edge of the ground plane 291 may be provided with a boundary wire 293. Multiple metal vias 28 may be provided on the boundary wire 293 so as to connect the upper ground plane 211.

In an example, the metal mesh structure on the lower ground plane 291 is formed of grids for which each side may be the minimum width of the process. In an example, the distance of every two adjacent metal vias 28 at the boundary wire 293 may be less than 1/20 of the working wavelength of the high-speed signal lines 255, 257. The high-speed signal lines 255, 257 may travel in a way that there is an angle of 45 degrees with the shape of grids on the lower ground plane 291 as much as possible.

It shall be noted that the lower ground plane 291 based on the metal mesh structure may facilitate increasing flexibility of the flexible circuit board 8. In addition, in order to further increase flexibility of the flexible circuit board 8, the bottom metal layer 29 may use thin metal material.

Referring to FIG. 11 and FIG. 13, the two high-speed signal lines 255, 257 are provided on the intermediate metal layer 25. Four high-speed ports 2501, 2503, 2506, 2508 and three grounding ports 2505, 2507, 2509 may be provided on the intermediate metal layer 25. Where two high-speed ports 2501 and 2506 connects two ends of the high-speed signal line 255, respectively; the other two high-speed ports 2503 and 2508 connects two ends of the high-speed signal line 257, respectively; the grounding ports 2505, 2507 may be connected with the two ground planes 211, 291 and located on the right side of the intermediate metal layer 25; the grounding port 2509 may be connected with the two ground planes 211 and 291 and located on the left side of the intermediate metal layer 25.

It shall be noted that the grounding port 2109 on the top metal layer 21 may connect the grounding port 2509 on the intermediate metal layer 25 and the grounding port 2909 on the bottom metal layer 29 by a metal via 22. The high-speed port 2106 on the top metal layer 21 may connect the high-speed port 2506 on the intermediate metal layer 25 and the high-speed port 2906 on the bottom metal layer 29 by a metal via 24. The high-speed port 2108 on the top metal layer 21 may connect the high-speed port 2508 on the intermediate metal layer 25 and the high-speed port 2908 on the bottom metal layer 29 by another metal via 24. The grounding port 2105 on the top metal layer 21 may connect the grounding port 2505 on the intermediate metal layer 25 and the grounding port 2905 on the bottom metal layer 29 by a further metal via 24. The grounding port 2107 on the top metal layer 21 may connect the grounding port 2507 on the intermediate metal layer 25 and the grounding port 2907 on the bottom metal layer 29 by a further metal via 24. In this way, the four metal vias 24 may form four pads of the flexible circuit board 8 together and be welded with the rigid circuit board 1.

The high-speed port 2101 on the top metal layer 21 may connect the high-speed port 2501 on the intermediate metal layer 25 and the high-speed port 2901 on the bottom metal layer 29 by a metal via 26. The high-speed port 2103 on the top metal layer 21 may connect the high-speed port 2503 on the intermediate metal layer 25 and the high-speed port 2903 on the bottom metal layer 29 by another metal via 26. In this way, the metal vias 26 may connect the optical chip. The metal vias 26 may also form two perforated pads on the flexible circuit board 8. The two perforated pads may be correspondingly welded with needle-like pins on the optical sub-assembly 3.

It may be understood that in the above examples, the shielding cage is substantially formed by two ground planes 211, 291, the metal via 22 connecting the two ground planes 211, 291 on the left side, metal vias 24 connecting the two ground planes 211, 291 on the right side, and metal vias 28 connecting the boundary wires 213, 293 of the two ground planes 211, 291. That is, the two ground planes 211, 291 may form the top and bottom planes of the shielding cage, respectively; and the metal vias 22, 24, 28 provided around the two ground planes 211, 291 may form a fence of the shielding cage. Where the fence may be used to connect the top plane and the bottom plane. The connecting effect of the metal vias 26 is different from that of the metal vias 28. The metal vias 26 may be used to realize an electrical connection function and the metal vias 28 may be used to form the fence of the shielding cage.

According to the above examples, on the flexible circuit board 8, two ground planes 211, 291 and multiple metal vias 22, 24, 28 may form the shielding cage, which encloses the high-speed signal lines 255, 257. In this way, the electromagnetic radiation from the high-speed signal lines 255, 257 which is leaked out of the flexible circuit board 8 may be greatly reduced, thereby effectively improving the EMC performance of the optical module 10c.

It shall be noted that in above examples, the flexible circuit board 8 has three metal layers 21, 25, 29, and in other examples, the flexible circuit board 8 may have more metal layers. The rigid circuit board 1 may also have a multi-layer structure and has metal vias similar to the flexible circuit board 8, and detailed description is omitted for brevity. In above examples, the ground plane 211 above the high-speed signal lines 255, 257 is provided on the top metal layer 21. In other examples, the ground plane above the high-speed signal lines 255, 257 may be provided on an intermediate metal layer thereon. For example, a second intermediate metal layer may be provided between the top metal layer 21 and the intermediate metal layer 25 and the upper ground plane 211 above the high-speed signal lines 255, 257 may be provided on the second intermediate metal layer. Similarly, in the above examples, the lower ground plane 291 below the high-speed signal lines 255, 257 is provided on the bottom metal layer 29. In other examples, the ground plane below the high-speed signal lines 255, 257 may be provided on an intermediate metal layer thereunder. For example, a third metal layer may be provided between the intermediate metal layer 25 and the bottom metal layer 29 and the lower ground plane 291 below the high-speed signal lines 255, 257 may be provided on the third metal layer. In the above examples, a pair of high-speed signal lines 255, 257 is described as an example; in other examples, there may be a single high-speed signal line or more high-speed signal lines.

As may be seen from the above description, the four metal vias 24 may form four pads of the flexible circuit board 8, and the flexible circuit board 8 and the rigid circuit board 1 may be connected by these pads. In practice, a distance between the optical chip driver and these pads is closer, e.g., less than 3 mm. When distance between the optical chip driver and these pads is father, e.g., greater than 3 mm, the rigid circuit board 1 may also be a multilayer board, for example, including two dielectric layers and three metal layers. The structure of the multilayer board may be similar to that of the flexible circuit board 8. A high-speed signal line may be further provided on the intermediate metal layer of the rigid circuit board 1. The optical chip driver and the pads may be electrically connected through the high-speed signal line. Multiple metal vias connecting the top metal layer and the bottom metal layer may be provided around the high-speed signal line. The top metal layer, the bottom metal layer and the multiple metal vias may form a shielding cage so as to realize electromagnetic shielding for the high-speed signal line. The implementation principle of the electromagnetic shielding is the same as that described above in the flexible circuit board 8, and further description is omitted for brevity. It shall be noted that compared with the flexible circuit board 8, since the rigid circuit board 1 is rigid, the ground plane in the top metal layer and the bottom metal layer of the rigid circuit board 1 may not be limited to the metal mesh structure, such as, a whole piece of a metal sheet or others.

Although technical solutions of the present disclosure is described above by taking how to realize electromagnetic shielding for the high-speed signal line connecting the optical chip and the optical chip driver as an example, it shall be understood by those skilled in the art that the present disclosure is not limited to the above examples. For example, the solution in the present disclosure may also be used to realize electromagnetic shielding for a high-speed signal line connecting the gold finger 4 and the optical chip driver. The solution in the present disclosure may be used for the high-speed signal line connecting the gold finger 4 and the optical chip driver and the high-speed signal line connecting the optical chip and the optical chip driver at the same time, or only for the high-speed signal line connecting the optical chip and the optical chip driver or the high-speed signal line connecting the gold finger 4 and the optical chip driver. It shall be noted that the present disclosure is not limited to the above examples. In fact, a shielding cage according to an example of the present disclosure may be added to any high-speed signal lines in the optical module. In addition, the electromagnetic shielding may be performed only for a part of the high-speed signal lines due to the process limitation. For example, the high-speed signal line at a connecting point between the gold finger 4 and the rigid circuit board 1 may not be performed electromagnetic shielding due to the process limitation; or a part of the high-speed signal line connecting the gold finger 4 and the optical chip driver may be performed electromagnetic shielding due to the process limitation.

The above is merely preferred examples of the present disclosure and is not intended to limit the present disclosure. Any modification, equivalent replacement, or improvement within the spirit and principles of the present disclosure should be considered within the range of the disclosure. Therefore, the scope of protection of the present disclosure is subject to the scope of protection claimed by the claims.

What is claimed is:

1. An optical module, comprising:
    an optical chip driver;
    an optical chip; and
    a flexible circuit board comprising:
        a first layer including a first ground plane, wherein an edge of the first ground plane is provided with a first boundary wire;
        a second layer including a second ground plane, wherein an edge of the second ground plane is provided with a second boundary wire;
        a high-speed signal line between the first ground plane and the second ground plane;
    wherein at least a part of the high-speed signal line is enclosed in a shielding cage formed by the first ground plane, the second ground plane, and a plurality of metal vias coupled to the first and second boundary wires and configured to connect the first ground plane and the second ground plane;
    a first dielectric layer positioned between the first layer and the high-speed signal line;
    a second dielectric layer positioned between the second layer and the high-speed signal line;
    wherein the metal vias pass through the first dielectric layer and the second dielectric layer to connect the first ground plane and the second ground plane;
    wherein each of the first ground plane and the second ground plane comprises a metal mesh structure;
    wherein each of the metal mesh structures in the first ground plane and the second ground plane is provided with a continuous follow wire passing through a respective region where the high-speed signal line is projected; and
    wherein the continuous follow wire is not parallel to wires forming the metal mesh structure.

2. The optical module according to claim 1, wherein a shape, a line width, and an orthographic projection position of the continuous follow wire are substantially consistent with those of the high-speed signal line.

3. The optical module according to claim 1, wherein the metal mesh structure is formed of square-shaped grids for which a side is between 2-4 mils.

4. The optical module according to claim 1, wherein a distance between every two adjacent metal vias is determined according to a working wavelength of the high-speed signal line.

5. The optical module according to claim 1, wherein the metal vias are substantially perpendicular to the first ground plane and the second ground plane.

6. The optical module according to claim 1, wherein one side for each of the first layer and the second layer away from the high-speed signal line is covered with an insulating film.

7. The optical module according to claim 1, wherein the optical chip and the optical chip driver are connected by the high-speed signal line.

8. The optical module according to claim 3, wherein the metal mesh structure is formed of square-shaped grids for which a side is between 2.5-3.8 mils.

9. The optical module according to claim 3, wherein the metal mesh structure is formed of square-shaped grids for which a side is between 3-3.5 mils.

10. The optical module according to claim 4, wherein the distance between every two adjacent metal vias does not exceed ½ of the working wavelength of the high-speed signal line.

11. The optical module according to claim 4, wherein the distance between every two adjacent metal vias does not exceed 1/10 of the working wavelength of the high-speed signal line.

12. The optical module according to claim 4, wherein the distance between every two adjacent metal vias does not exceed 1/15 of the working wavelength of the high-speed signal line.

13. The optical module according to claim 4, wherein the distance between every two adjacent metal vias does not exceed 1/20 of the working wavelength of the high-speed signal line.

* * * * *